(12) United States Patent
Sekiya

(10) Patent No.: US 7,915,142 B2
(45) Date of Patent: Mar. 29, 2011

(54) WAFER PROCESSING METHOD

(75) Inventor: Kazuma Sekiya, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/781,116

(22) Filed: May 17, 2010

(65) Prior Publication Data

US 2010/0311225 A1   Dec. 9, 2010

(30) Foreign Application Priority Data

Jun. 3, 2009  (JP) .................................. 2009-134344

(51) Int. Cl.
*H01L 21/00* (2006.01)
(52) U.S. Cl. ........................................ 438/463; 438/460
(58) Field of Classification Search .................. None
See application file for complete search history.

(56) References Cited

FOREIGN PATENT DOCUMENTS

JP      10-305420      11/1998

*Primary Examiner* — David Vu
*Assistant Examiner* — Shantanu C Pathak
(74) *Attorney, Agent, or Firm* — Greer, Burns & Crain, Ltd.

(57) ABSTRACT

A wafer processing method for dividing a wafer into individual devices along streets. The wafer processing method includes the steps of forming a division groove on the front side of the wafer along each street, attaching the front side of the wafer to the front side of a rigid plate having a plurality of grooves by using an adhesive resin, applying ultraviolet radiation to the adhesive resin to thereby increase the holding force of the adhesive resin, grinding the back side of the wafer to expose the division grooves to the back side of the wafer, attaching an adhesive tape to the back side of the wafer, immersing the wafer and the rigid plate in hot water to swell the adhesive resin, thereby decreasing the holding force of the adhesive resin, and removing the rigid plate from the front side of the wafer.

6 Claims, 13 Drawing Sheets

WAFER PROCESSING METHOD

BACKGROUND OF THE INVENTION

1. Field of the Invention

The present invention relates to a wafer processing method for dividing a wafer into individual devices along a plurality of crossing streets formed on the front side of the wafer, the individual devices being respectively formed in a plurality of regions partitioned by the streets.

2. Description of the Related Art

In a semiconductor device fabrication process, a plurality of crossing division lines called streets are formed on the front side of a substantially disk-shaped semiconductor wafer to thereby partition a plurality of regions where devices such as ICs and LSIs are respectively formed. The semiconductor wafer is cut along the streets to thereby divide the regions where the devices are formed from each other, thus obtaining the individual devices. Further, an optical device wafer is formed by laminating gallium nitride compound semiconductors or the like on a sapphire substrate or a silicon carbide substrate. The optical device wafer is also cut along the streets to obtain individual optical devices divided from each other, such as light emitting diodes and laser diodes, which are widely used in electric equipment.

Cutting of such a wafer along the streets is usually performed by using a cutting apparatus having a cutting blade for cutting the wafer at a high rotational speed. However, the sapphire substrate and the silicon carbide substrate mentioned above are hard-to-machine materials having high Mohs hardness, so that a cutting speed must be reduced, causing a reduction in productivity. As a method of dividing an optical device wafer along the streets, a laser processing method using a pulsed laser beam having an absorption wavelength to the wafer has been proposed in recent years. In this laser processing method, the pulsed laser beam is applied to the wafer along the streets to thereby form laser processed grooves along the streets. By applying an external force to the wafer along the laser processed grooves, the wafer is broken along the laser processed grooves to obtain the individual optical devices (see Japanese Patent Laid-open No. Hei 10-305420, for example).

SUMMARY OF THE INVENTION

In the case of grinding the back side of a wafer formed from a sapphire substrate or a silicon carbide substrate to reduce the thickness of the wafer to about 50 µm by using a grinding apparatus before forming the laser processed grooves along the streets on the front side of the wafer, so as to improve the characteristics of each optical device, there is a possibility of warpage of the wafer. As a result, the focal point of the laser beam cannot be set at a proper position and the wafer cannot therefore be divided accurately along the streets.

It is therefore an object of the present invention to provide a wafer processing method which can accurately divide the wafer along the streets and can reduce the thickness of each device divided from the wafer.

In accordance with an aspect of the present invention, there is provided a wafer processing method for dividing a wafer into individual devices along a plurality of crossing streets formed on the front side of the wafer, the individual devices being respectively formed in a plurality of regions partitioned by the streets, the wafer processing method, including a division groove forming step of forming a division groove having a depth corresponding to the finished thickness of each device on the front side of the wafer along each street; a rigid plate attaching step of attaching the front side of the wafer having the division grooves to the front side of a rigid plate having a plurality of grooves by using an adhesive resin having the properties of increasing a holding force when cured by the application of ultraviolet radiation and decreasing the holding force when swelled by the inclusion of water after performing the division groove forming step; a holding force increasing step of applying ultraviolet radiation to the adhesive resin to cure the adhesive resin, thereby increasing the holding force of the adhesive resin after performing the rigid plate attaching step; a back grinding step of grinding the back side of the wafer to expose the division grooves to the back side of the wafer, thereby dividing the wafer into the individual devices after performing the holding force increasing step; an adhesive tape attaching step of attaching the back side of the wafer to an adhesive tape after performing the back grinding step; a holding force decreasing step of immersing the wafer and the rigid plate in hot water to swell the adhesive resin, thereby decreasing the holding force of the adhesive resin after performing the adhesive tape attaching step; and a rigid plate removing step of removing the rigid plate from the front side of the wafer after performing the holding force decreasing step; the rigid plate attaching step including the steps of filling each groove formed on the front side of the rigid plate with a water permeable layer having good water permeability and next attaching the front side of the wafer through the adhesive resin to the front side of the rigid plate; the holding force decreasing step including the step of introducing the hot water to the adhesive resin through the water permeable layer filling each groove formed on the front side of the rigid plate.

Preferably, each groove formed on the front side of the rigid plate has a width of 0.1 to 0.5 mm and a depth of 0.1 to 0.5 mm, and the spacing of any adjacent ones of the plural grooves formed on the front side of the rigid plate is set to 1 to 2 mm. Preferably, the rigid plate is formed of a material capable of transmitting ultraviolet radiation; and the holding force increasing step includes the step of applying ultraviolet radiation from the back side of the rigid plate through the rigid plate to the adhesive resin.

Preferably, the division groove forming step includes the step of applying a laser beam having an absorption wavelength to the wafer from the front side of the wafer along each street, thereby forming the division groove along each street. Preferably, the wafer processing method further includes the step of forming a layer of the adhesive resin on the front side of the wafer before performing the division groove forming step; the laser beam being applied through the layer of the adhesive resin to the front side of the wafer in the division groove forming step; the rigid plate attaching step including the step of attaching the front side of the wafer to the front side of the rigid plate through the layer of the adhesive resin formed on the front side of the wafer.

According to the present invention, the wafer can be divided accurately along the streets without the influence of warpage of the wafer reduced in thickness.

Further, the holding force of the adhesive resin for attaching the wafer to the rigid plate is increased by performing the holding force increasing step before the back grinding step. Accordingly, the wafer can be reliably held through the adhesive resin to the rigid plate in the back grinding step, so that the movement of the wafer can be prevented to thereby prevent the occurrence of chipping on the wafer.

Further, the rigid plate attaching step includes the steps of filling each groove formed on the front side of the rigid plate with the water permeable layer and next attaching the front side of the wafer through the adhesive resin to the front side of the rigid plate. In the holding force decreasing step, the hot water is introduced through the water permeable layer to the adhesive resin, so that the adhesive resin is effectively swelled by the hot water to thereby decrease the holding force of the adhesive resin. Accordingly, the rigid plate can be easily removed from the front side of the wafer in the rigid plate removing step.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
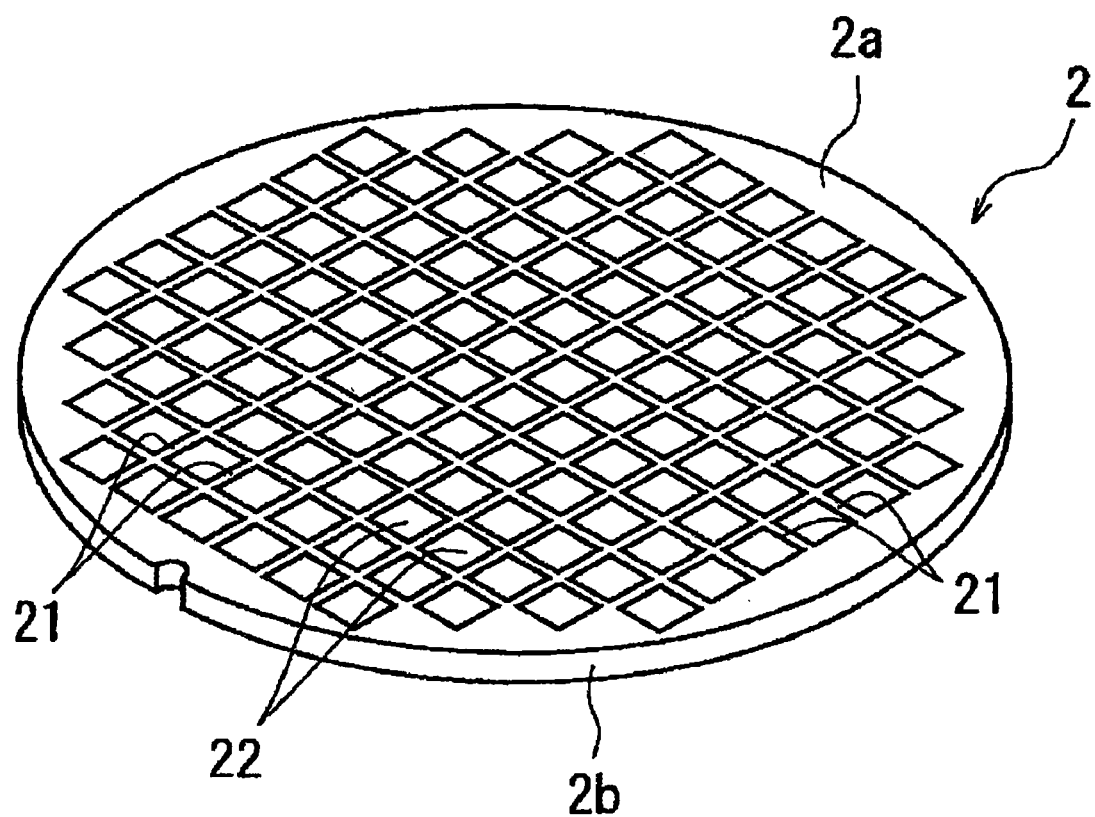
FIG. 1 is a perspective view showing an optical device wafer as a wafer.

A preferred embodiment of the wafer processing method according to the present invention will now be described in detail with reference to the attached drawings. FIG. 1 is a perspective view of an optical device wafer 2 as a wafer. The optical device wafer 2 shown in FIG. 1 is formed from a sapphire wafer having a thickness of 600 μm, for example. The optical device wafer 2 has a front side 2a and a back side 2b. A plurality of crossing streets 21 are formed on the front side 2a of the optical device wafer 2 to thereby partition a plurality of rectangular regions where a plurality of optical devices 22 such as light emitting diodes and laser diodes are respectively formed. These optical devices 22 are formed by laminating gallium nitride compound semiconductors or the like. There will now be described a wafer processing method for dividing the optical device wafer 2 into the individual optical devices 22 along the streets 21.

Figure 2:
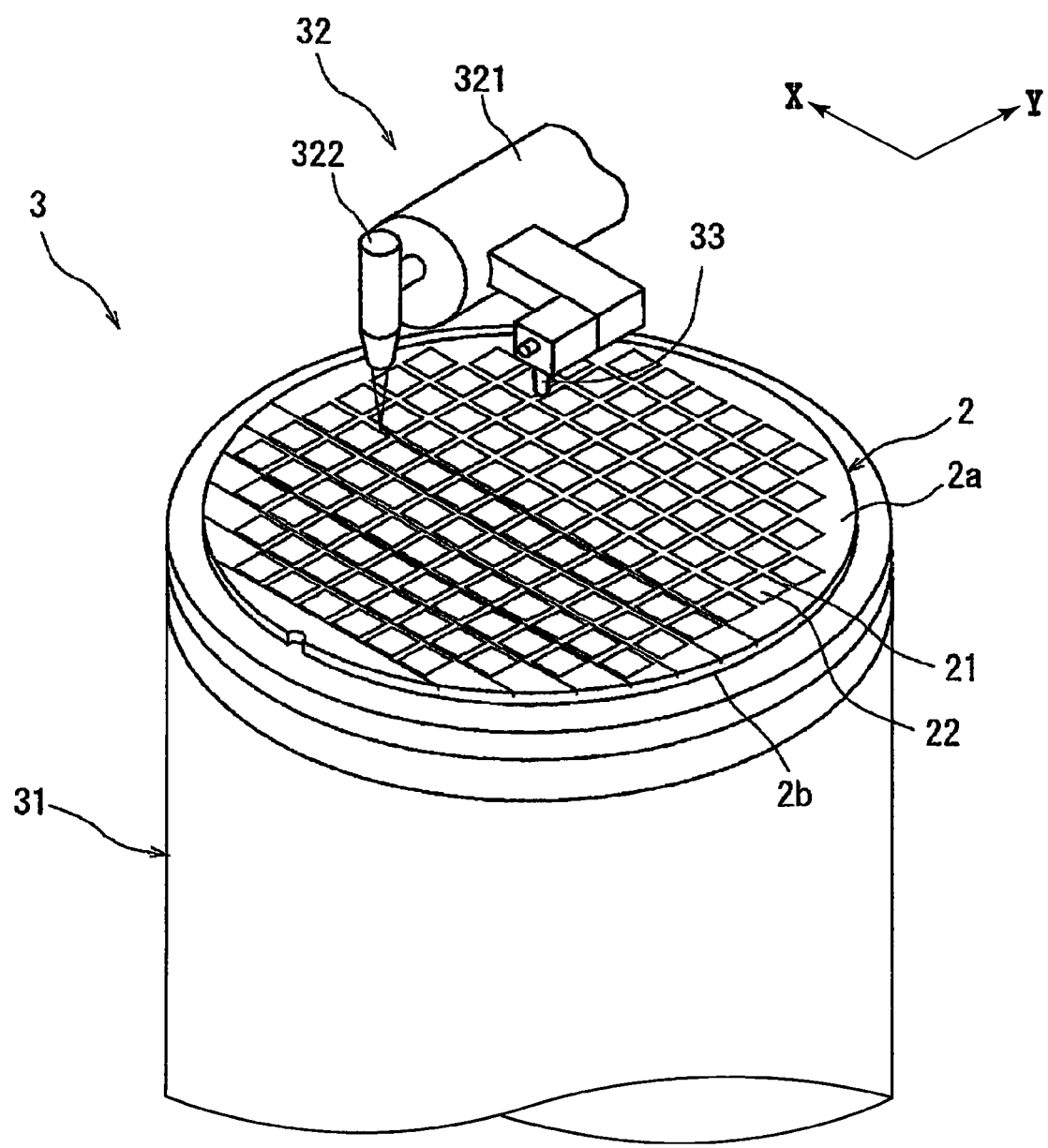
FIG. 2 is a perspective view showing an essential part of a laser processing apparatus for performing a division groove forming step in the wafer processing method according to the present invention.

In the wafer processing method according to the present invention, a division groove forming step is performed to form a division groove having a depth corresponding to the finished thickness of each optical device 22 on the front side 2a of the optical device wafer 2 along each street 21. In this preferred embodiment, this division groove forming step is performed by using a laser processing apparatus 3 shown in FIG. 2. The laser processing apparatus 3 shown in FIG. 2 includes a chuck table 31 for holding the wafer 2, laser beam applying means 32 for applying a laser beam to the wafer 2 held on the chuck table 31, and imaging means 33 for imaging the wafer 2 held on the chuck table 31. The chuck table 31 is so configured as to hold the wafer 2 by using suction means (not shown). The chuck table 31 is movable both in a feeding direction shown by an arrow X in FIG. 2 and in an indexing direction shown by an arrow Y in FIG. 2 by means of a moving mechanism (not shown).

The laser beam applying means 32 includes a cylindrical casing 321 extending in a substantially horizontal direction. Although not shown, the casing 321 contains pulsed laser beam oscillating means including a pulsed laser beam oscillator and repetition frequency setting means. Examples of the pulsed laser beam oscillator includes a YAG laser oscillator and a YVO4 laser oscillator. The laser beam applying means 32 further includes focusing means 322 mounted on the front end of the casing 321 for focusing the pulsed laser beam oscillated from the pulsed laser beam oscillating means.

The imaging means 33 is mounted on the front end portion of the casing 321 of the laser beam applying means 32. The imaging means 33 includes illuminating means for illuminating the wafer 2, an optical system for capturing an area illuminated by the illuminating means, and an imaging device (CCD) for imaging the area captured by the optical system. An image signal output from the imaging means 33 is transmitted to control means (not shown).

The division groove forming step using the laser processing apparatus 3 mentioned above will now be described with reference to FIG. 2 and FIGS. 3A to 3C. In performing the division groove forming step, the wafer 2 is first placed on the chuck table 31 of the laser processing apparatus 3 shown in FIG. 2 in the condition where the back side 2b of the wafer 2 comes into contact with the upper surface of the chuck table 31, i.e., the front side 2a of the wafer 2 is oriented upward. Thereafter, the suction means is operated to hold the wafer 2 on the chuck table 31 under suction.

Thereafter, the chuck table 31 thus holding the wafer 2 is moved to a position directly below the imaging means 33 by work feed means. In the condition where the chuck table 31 is positioned directly below the imaging means 33, an alignment operation is performed by the imaging means 33 and the control means to detect a subject area of the wafer 2 to be laser-processed. More specifically, the imaging means 33 and the control means perform image processing such as pattern matching for making the alignment of the streets 21 extending in a first direction on the wafer 2 and the focusing means 322 of the laser beam applying means 32 for applying the laser beam along the streets 21, thus performing the alignment of a laser beam applying position. This alignment operation is performed similarly for the other streets 21 extending in a second direction perpendicular to the first direction mentioned above on the wafer 2.

Figure 3A:
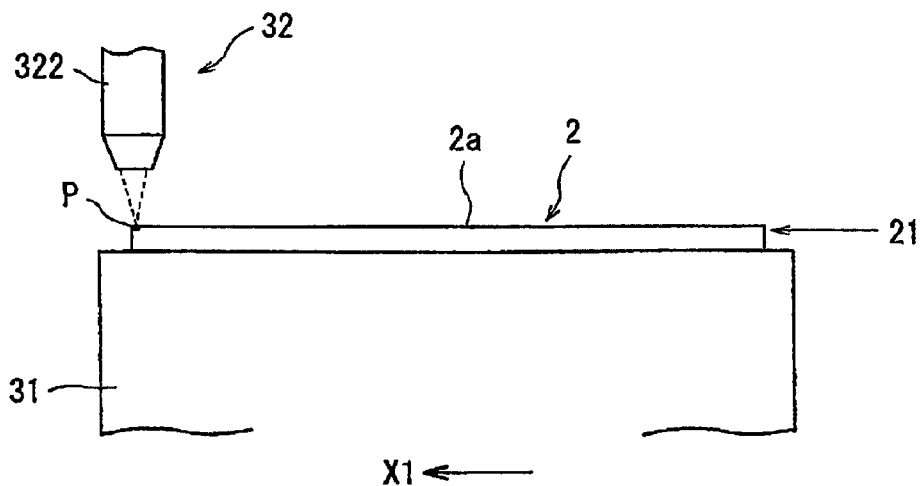
FIGS. 3A to 3C are sectional side views for illustrating the division groove forming step using the laser processing apparatus shown in FIG. 2.
Figure 3B:
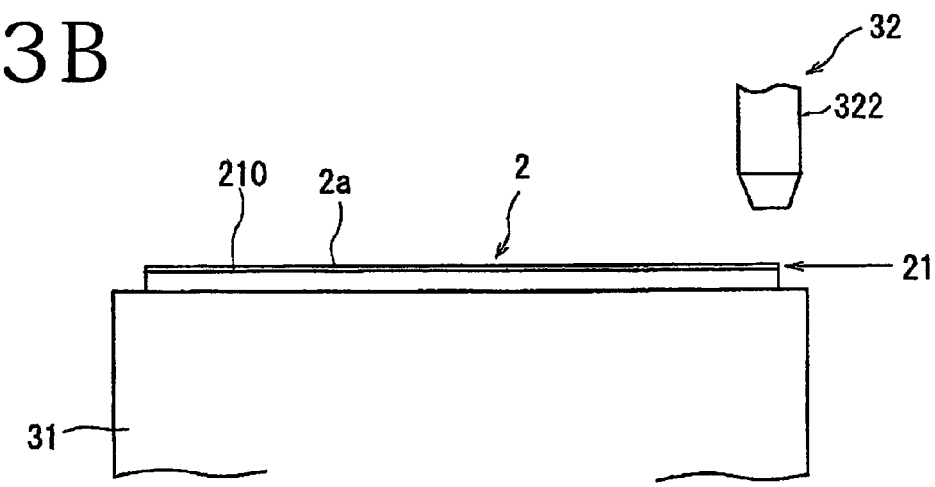
Figure 3C:
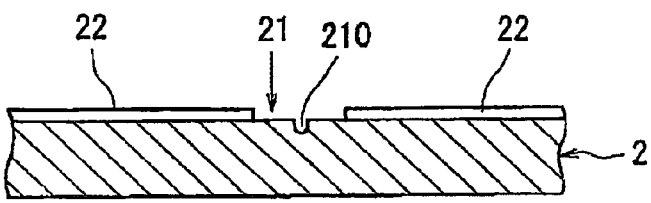

After performing the alignment operation for all of the streets 21 on the wafer 2 as mentioned above, the chuck table 31 is moved to a laser beam applying area where the focusing means 322 of the laser beam applying means 32 is located as shown in FIG. 3A, thereby positioning one end (left end as viewed in FIG. 3A) of a predetermined one of the streets 21 extending in the first direction directly below the focusing means 322. In this condition, a pulsed laser beam having an absorption wavelength to the sapphire wafer 2 is applied from the focusing means 322 to the wafer 2, and the chuck table 31 is moved in a direction shown by an arrow X1 in FIG. 3A at a predetermined feed speed. When the other end (right end as viewed in FIG. 3B) of the predetermined street 21 reaches the position directly below the focusing means 322 as shown in FIG. 3B, the application of the pulsed laser beam is stopped and the movement of the chuck table 31 is also stopped. As shown in FIG. 3A, the focal point P of the pulsed laser beam is set near the front side 2a (upper surface) of the wafer 2, so that a division groove 210 having a depth corresponding to the finished thickness (e.g., 50 μm) of each optical device 22 is formed on the front side 2a of the wafer 2 along the predetermined street 21 as shown in FIG. 3C.

For example, the division groove forming step mentioned above is performed under the following processing conditions.

Light source for the laser beam: semiconductor pumped solid-state laser (Nd:YAG)
Wavelength: 355 nm
Pulse energy: 35 μJ
Repetition frequency: 100 kHz
Pulse width: 180 ns
Focused spot diameter: ϕ4 μm
Work feed speed: 60 mm/second After performing the division groove forming step along all of the streets 21 extending in the first direction, the chuck table 31 is rotated 90° to similarly perform the division groove forming step along all of the other streets 21 extending in the second direction perpendicular to the first direction. As a result, the division groove 210 having a depth corresponding to the finished thickness (e.g., 50 μm) of each optical device 22 is formed on the front side 2a of the wafer 2 along each street 21. While the division groove forming step is performed by using the laser processing apparatus 3 in this preferred embodiment, the division groove forming step may be performed by using a cutting apparatus.

Figure 4A:
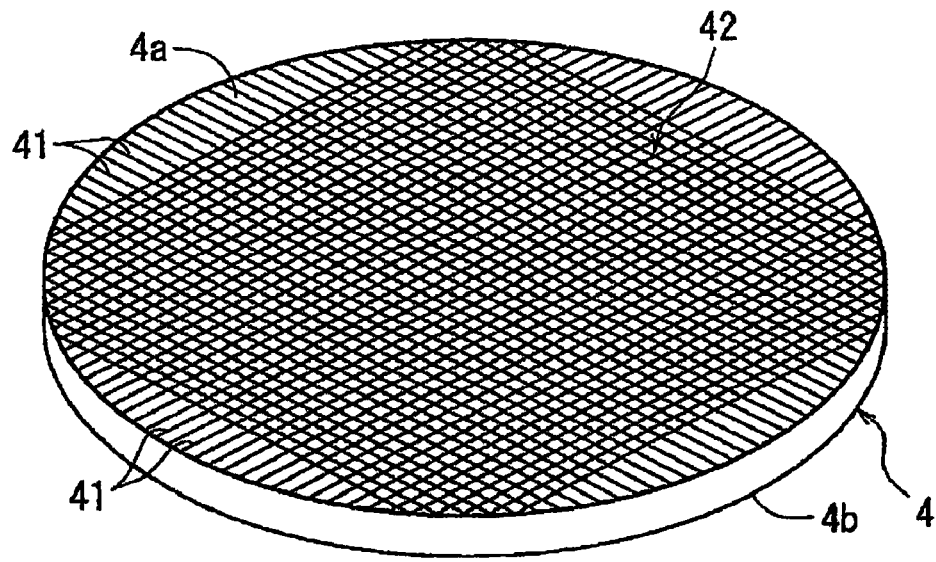
FIGS. 4A and 4B are perspective and sectional views, respectively, showing a rigid plate having a plurality of grooves to be used in a rigid plate attaching step in the wafer processing method according to the present invention.
Figure 4B:
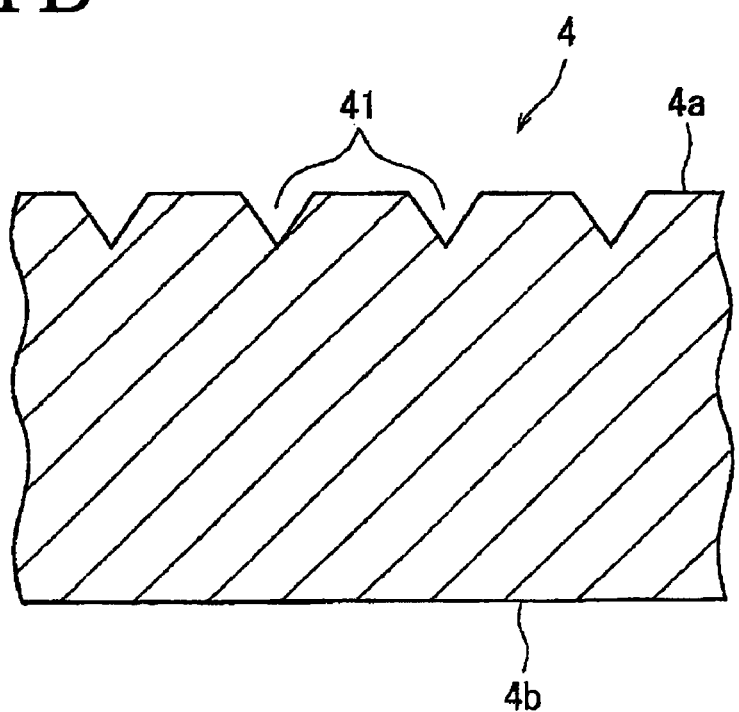

After performing the division groove forming step mentioned above, a rigid plate attaching step is performed in such a manner that the front side 2a of the wafer 2 having the division grooves 210 is attached to the front side of a rigid plate having a plurality of grooves by using an adhesive resin having the properties of increasing a holding force when cured by the application of ultraviolet radiation and decreasing the holding force when swelled by the inclusion of water. More specifically, a disk-shaped rigid plate 4 shown in FIGS. 4A and 4B is prepared as a protective member for protecting the optical devices 22 formed on the front side 2a of the wafer 2. The rigid plate 4 is formed of a material capable of transmitting ultraviolet radiation, such as glass and synthetic resin (e.g., polyethylene terephthalate). The rigid plate 4 has a diameter larger than that of the wafer 2. The rigid plate 4 has a front side 4a and a back side 4b, wherein a plurality of grooves 41 intersecting at right angles are formed on the front side 4a of the rigid plate 4. Each groove 41 extends so that its opposite ends reach the outer circumference of the rigid plate 4. In the case that the rigid plate 4 has the same size as that of the wafer 2, the opposite ends of each groove 41 formed on the front side 4a of the rigid plate 4 must reach the outer circumference of the rigid plate 4. However, in the case that the rigid plate 4 is larger in size than the wafer 2 as in this preferred embodiment, it is sufficient that the opposite ends of each groove 41 reach the outside of an attaching area where the wafer 2 is to be attached on the front side 4a of the rigid plate 4. That is, in this case, it is not always necessary to make the opposite ends of each groove 41 reach the outer circumference of the rigid plate 4. Preferably, each groove 41 has a width of 0.1 to 0.5 mm and a depth of 0.1 to 0.5 mm, and the spacing of any adjacent ones of the plural grooves 41 is set to 1 to 2 mm.

Figure 5A:
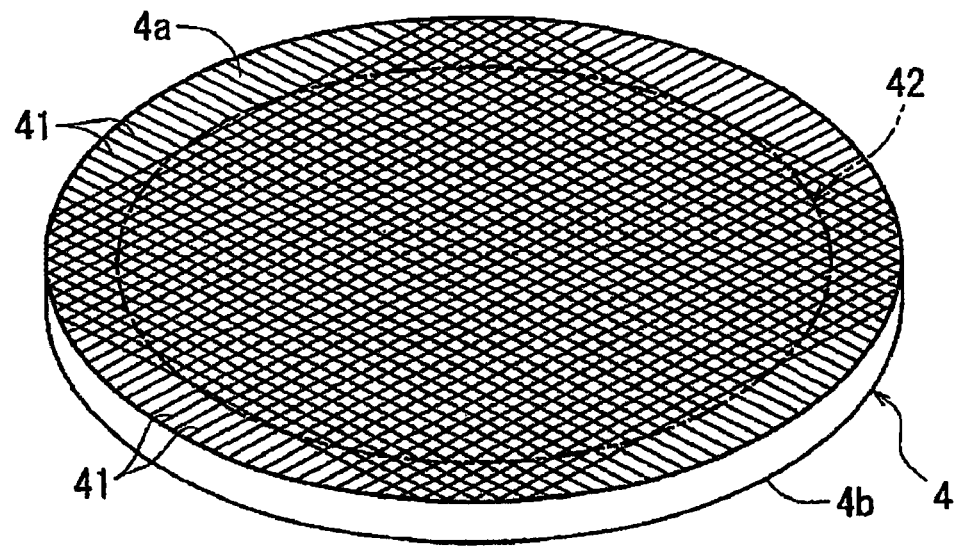
FIGS. 5A and 5B are perspective and sectional views, respectively, showing the rigid plate in the condition where each groove formed on the front side of the rigid plate is filled with a water permeable layer having good water permeability in the rigid plate attaching step.
Figure 5B:
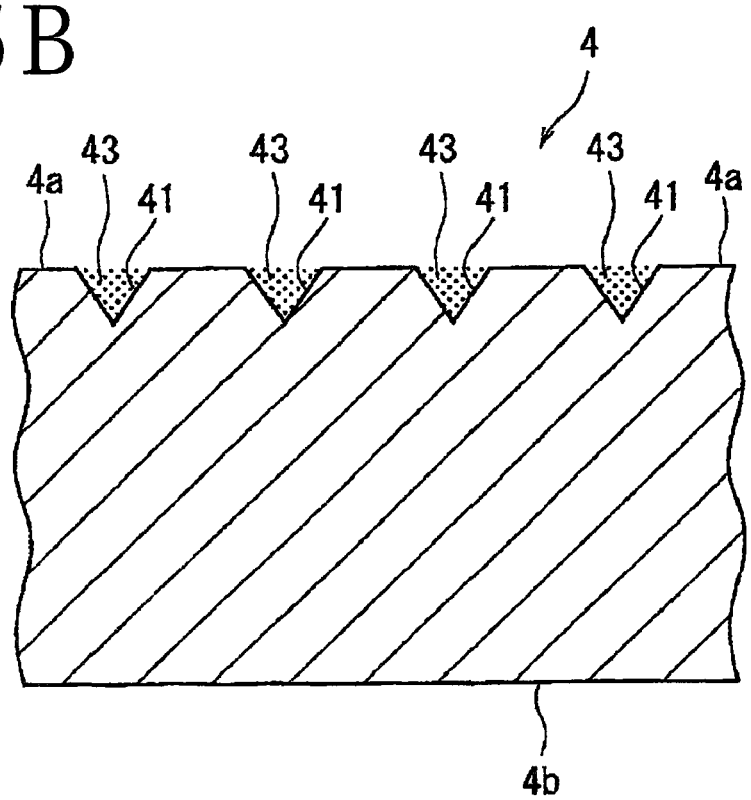

As shown in FIG. 5A, a circular attaching area 42 having the same size as that of the wafer 2 is formed on the front side 4a of the rigid plate 4. As shown in FIG. 5B, each groove 41 formed in the attaching area 42 on the front side 4a of the rigid plate 4 is filled with a water permeable layer 43 having good water permeability. The water permeable layer 43 may be formed by using a surface active agent having good water permeability. Examples of such a surface active agent include Unitox ethoxylated alcohol (registered trademark) (waxlike nonionic surface active agent) manufactured and marketed by Toyo Petrolite Co., Ltd. under the trade names of Unitox 380, Unitox 420, Unitox 450, and Unitox 480. As a modification, powder of active carbon, starch, etc. may also be used for the water permeable layer 43.

Figure 6A:
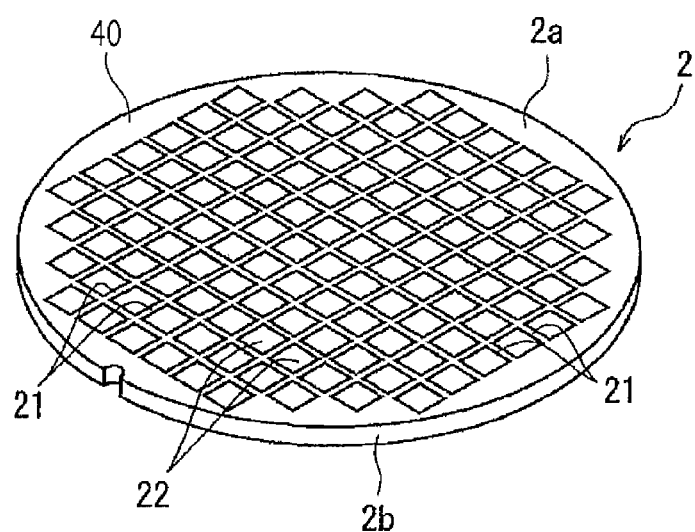
FIGS. 6A to 6C are views for illustrating the rigid plate attaching step.
Figure 6B:
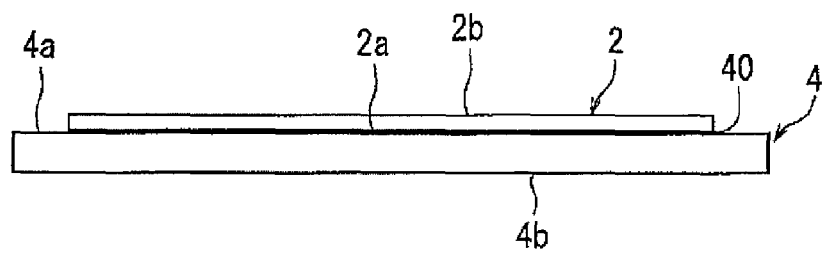
Figure 6C:
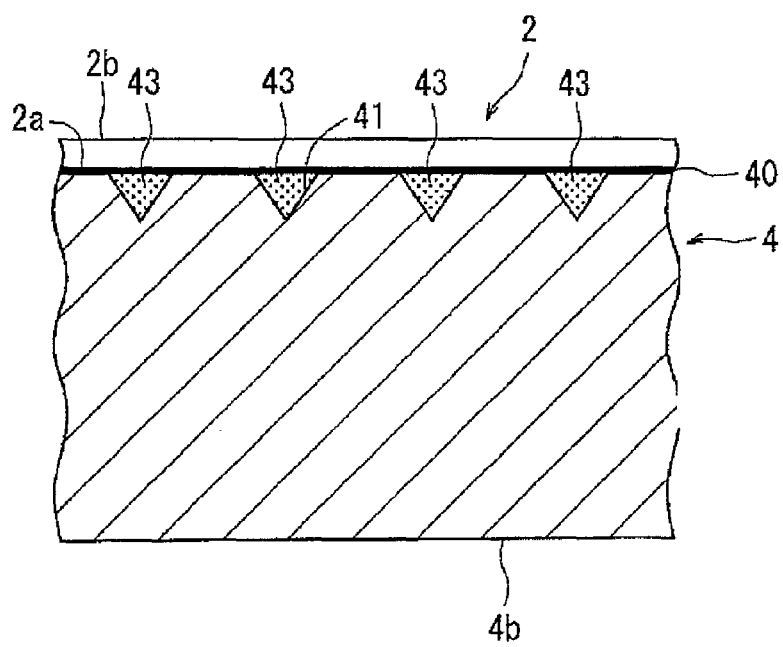

Thereafter, as shown in FIG. 6A, an adhesive resin 40 having the properties of increasing a holding force when cured by the application of ultraviolet radiation and decreasing the holding force when swelled by the inclusion of water is applied to the front side 2a of the wafer 2. Thereafter, as shown in FIGS. 6B and 6C, the front side 2a of the wafer 2 is attached through the adhesive resin 40 applied to the front side 2a of the wafer 2 to the attaching area 42 of the front side 4a of the rigid plate 4 having the plural grooves 41 filled with the water permeable layers 43. For example, 30Y-632D-3 manufactured by Threebond Co., Ltd. may be used as the adhesive resin 40. As a modification, the adhesive resin 40 may be applied to the attaching area 42 of the front side 4a of the rigid plate 4 having the plural grooves 41 filled with the water permeable layers 43, and the front side 2a of the wafer 2 may be next attached through the adhesive resin 40 to the attaching area 42.

As another modification, the adhesive resin 40 may be applied to the front side 2a of the wafer 2 before performing the division groove forming step. That is, after forming a layer of the adhesive resin 40 on the front side 2a of the wafer 2, a laser beam having an absorption wavelength to the wafer 2 may be applied through this layer of the adhesive resin 40 to the front side 2a of the wafer 2 to form the division grooves 210. Thereafter, the rigid plate attaching step may be performed to attach the front side 2a of the wafer 2 through the adhesive resin 40 to the attaching area 42 of the front side 4a of the rigid plate 4 having the plural grooves 41 filled with the water permeable layers 43. In the case of applying the adhesive resin 40 to the front side 2a of the wafer 2 before performing the division groove forming step, it is possible to prevent a degradation in quality of the optical devices 22 due to the deposition of debris onto the front side of each optical device 22, wherein the debris may be generated by the application of the laser beam along the streets 21 of the wafer 2 in the division groove forming step. Further, in this case, the adhesive resin 40 applied to the front side 2a of the wafer 2 functions to attach the front side 2a of the wafer 2 to the front side 4a of the rigid plate 4 in the rigid plate attaching step.

Figure 7:
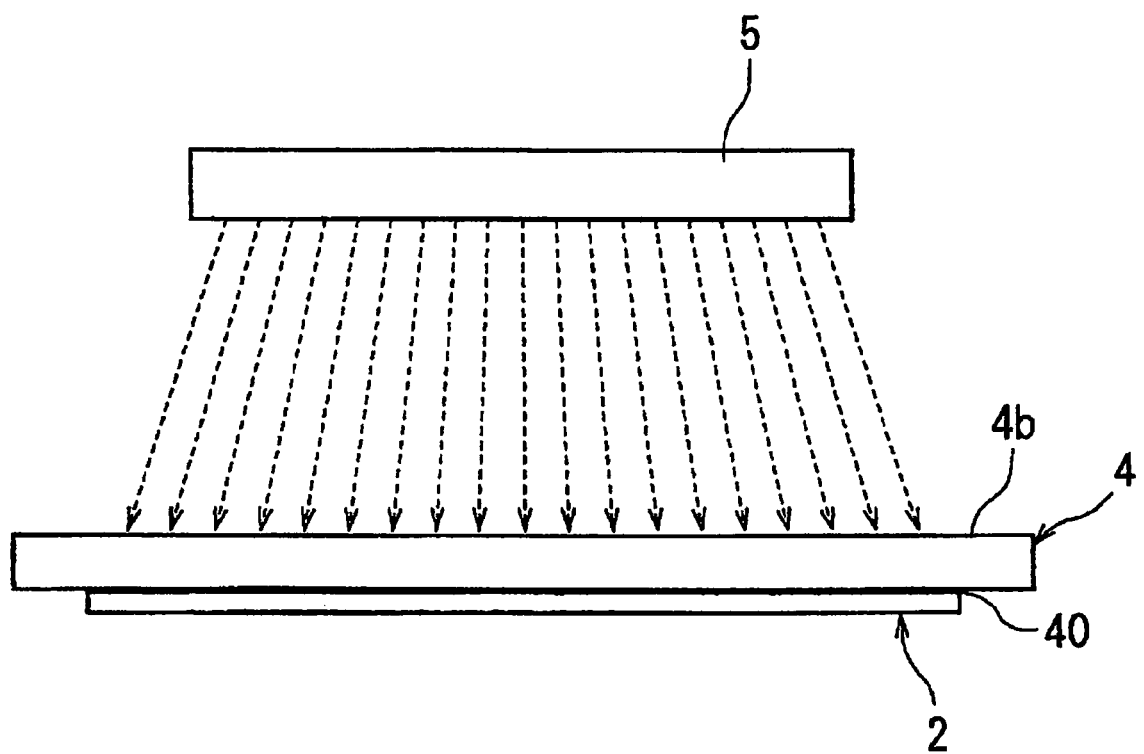
FIG. 7 is a side view for illustrating a holding force increasing step in the wafer processing method according to the present invention.

After performing the rigid plate attaching step, a holding force increasing step is performed in such a manner that ultraviolet radiation is applied to the adhesive resin 40 to cure the adhesive resin 40, thereby increasing the holding force of the adhesive resin 40. More specifically, as shown in FIG. 7, ultraviolet radiation applying means 5 is used to apply ultraviolet radiation from the back side 4*b* of the rigid plate 4 through the rigid plate 4 to the adhesive resin 40 present on the front side 40 of the rigid plate 4. As a result, the adhesive resin 40 is cured by the ultraviolet radiation to thereby increase the holding force. In this preferred embodiment, the rigid plate 4 is formed of a material capable of transmitting ultraviolet radiation. Accordingly, the ultraviolet radiation applied to the back side 4*b* of the rigid plate 4 is transmitted through the rigid plate 4 to reach the adhesive resin 40 present on the front side 4*a* of the rigid plate 4. However, in the case that the wafer 2 is formed from a sapphire wafer capable of transmitting ultraviolet radiation as in this preferred embodiment, ultraviolet radiation may be applied from the wafer 2 side (from the front side 4*a* of the rigid plate 4) through the wafer 2 to the adhesive resin 40. In this case, it is not always necessary to use a material capable of transmitting ultraviolet radiation for the rigid plate 4.

After performing the holding force increasing step, a back grinding step is performed in such a manner that the back side 2*b* of the wafer 2 is ground to expose the division grooves 210 to the back side 2*b* of the wafer 2, thereby dividing the wafer 2 into the individual optical devices 22. This back grinding step is performed by using a grinding apparatus 6 shown in FIG. 8A. The grinding apparatus 6 shown in FIG. 8A includes a chuck table 61 for holding the wafer 2 protected by the rigid plate 4 and grinding means 62 for grinding the back side 2*b* of the wafer 2 held on the chuck table 61. The chuck table 61 has an upper surface as a holding surface for holding the wafer 2 under suction and is rotatable in the direction shown by an arrow 61*a* in FIG. 8A. The grinding means 62 includes a spindle housing 621, a rotating spindle 622 rotatably supported to the spindle housing 621 so as to be rotated by a rotational driving mechanism (not shown), a mounter 623 mounted on the lower end of the rotating spindle 622, and a grinding wheel 624 mounted on the lower surface of the mounter 623. The grinding wheel 624 is composed of a disk-shaped base 625 and an abrasive ring 626 fixed to the lower surface of the base 625. The abrasive ring 626 is composed of a plurality of abrasive members annularly arranged at given intervals along the outer circumference of the base 625. The base 625 is mounted on the lower surface of the mounter 623 by means of bolts 627.

Figure 8A:
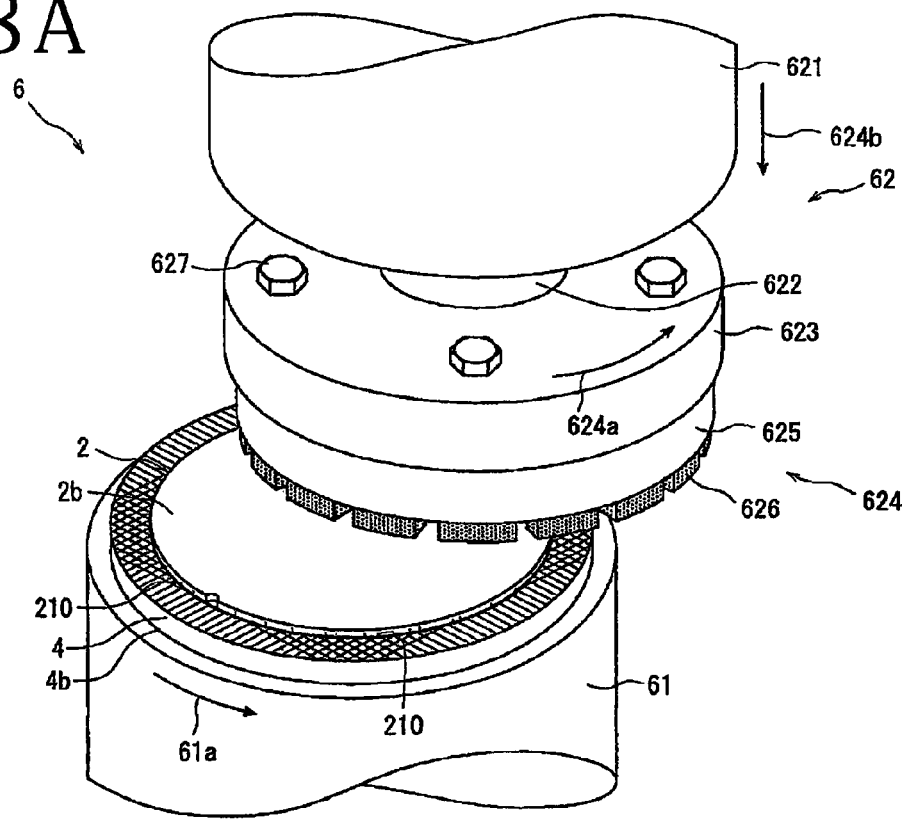
FIGS. 8A to 8C are views for illustrating a back grinding step in the wafer processing method according to the present invention.
Figure 8B:
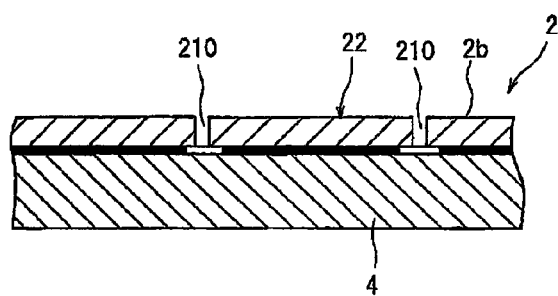
Figure 8C:
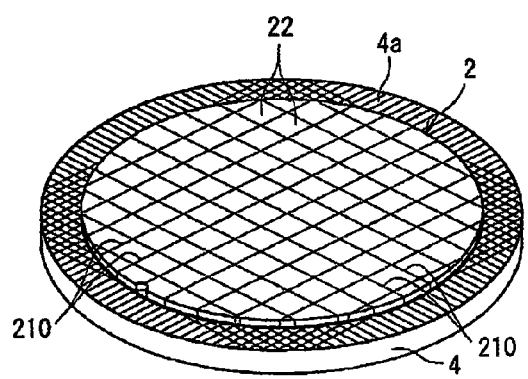

The back grinding step using the grinding apparatus 6 is performed in the following manner. As shown in FIG. 8A, the optical device wafer 2 with the rigid plate 4 as a protective plate is placed on the chuck table 61 in the condition where the back side 4*b* of the rigid plate 4 attached through the adhesive resin 40 to the front side 2*a* of the wafer 2 comes into contact with the upper surface (holding surface) of the chuck table 61. Thereafter, suction means (not shown) is operated to hold the wafer 2 through the rigid plate 4 on the chuck table 61 under suction (wafer holding step). Accordingly, the back side 2*b* of the wafer 2 held on the chuck table 61 is oriented upward. Thereafter, the chuck table 61 is rotated at 300 rpm, for example, in the direction shown by the arrow 61*a* in FIG. 8A, and the grinding wheel 624 of the grinding means 62 is rotated at 6000 rpm, for example, in the direction shown by an arrow 624*a* in FIG. 8A. At the same time, a feed mechanism (not shown) is operated to lower the grinding wheel 624 until the abrasive ring 626 comes into contact with the back side 2*b* of the wafer 2. Thereafter, the grinding wheel 624 is fed downward by a predetermined amount at a predetermined feed rate as shown by an arrow 624*b* in FIG. 8A. As a result, the back side 2*b* of the wafer 2 is ground to reduce the thickness of the wafer 2 to the finished thickness (e.g., 50 μm) of each optical device 22. That is, as shown in FIG. 8B, the division grooves 210 are exposed to the back side 2*b* of the wafer 2, so that the wafer 2 is divided along the streets 21 corresponding to the division grooves 210 to obtain the individual optical devices 22 attached to the rigid plate 4 as shown in FIG. 8C.

In this manner, the back side 2*b* of the wafer 2 is ground to expose the division grooves 210 to the back side 2*b*, thereby dividing the wafer 2 into the individual optical devices 22. Accordingly, the wafer 2 can be divided accurately along the streets 21 without the influence of warpage of the wafer 2 reduced in thickness. Further, the holding force of the adhesive resin 40 for attaching the wafer 2 to the rigid plate 4 is increased by performing the holding force increasing step before the back grinding step. Accordingly, the wafer 2 can be reliably held through the adhesive resin 40 to the rigid plate 4 held on the chuck table 61 in the back grinding step, so that the movement of the wafer 2 can be prevented to thereby prevent the occurrence of chipping on the wafer 2.

Figure 9A:
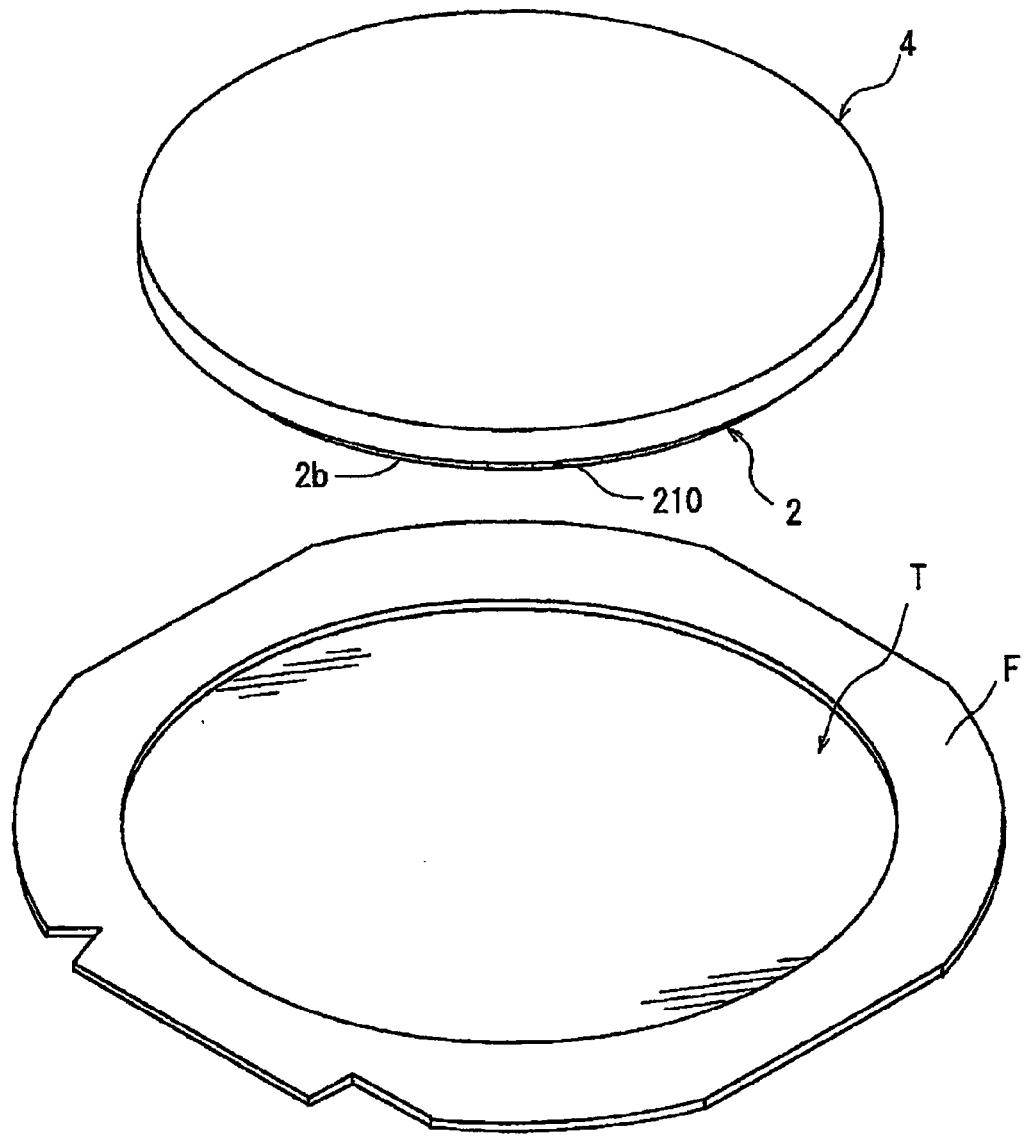
FIGS. 9A and 9B are views for illustrating an adhesive tape attaching step in the wafer processing method according to the present invention.
Figure 9B:
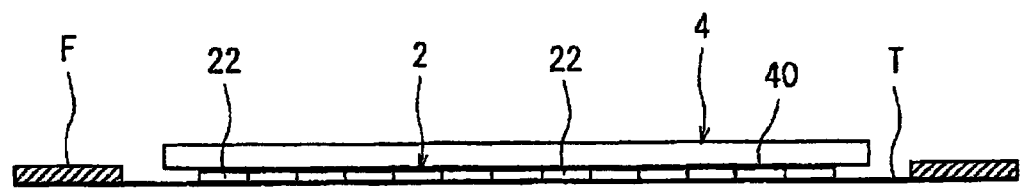

After performing the back grinding step, an adhesive tape attaching step is performed in such a manner that the back side 2*b* of the wafer 2 is attached to an adhesive tape T as shown in FIGS. 9A and 9B. More specifically, the adhesive tape T is preliminarily supported at its outer circumferential portion to an annular frame F so as to close the inner opening of the annular frame F. The back side 2*b* of the wafer 2 attached to the rigid plate 4 is attached to the adhesive tape T. The adhesive tape T is composed of a base sheet and an adhesive layer formed on the front side of the base sheet. For example, the base sheet is formed of polyvinyl chloride and has a thickness of 80 μm, and the adhesive layer is formed of acrylic resin and has a thickness of about 5 μm.

Figure 10:
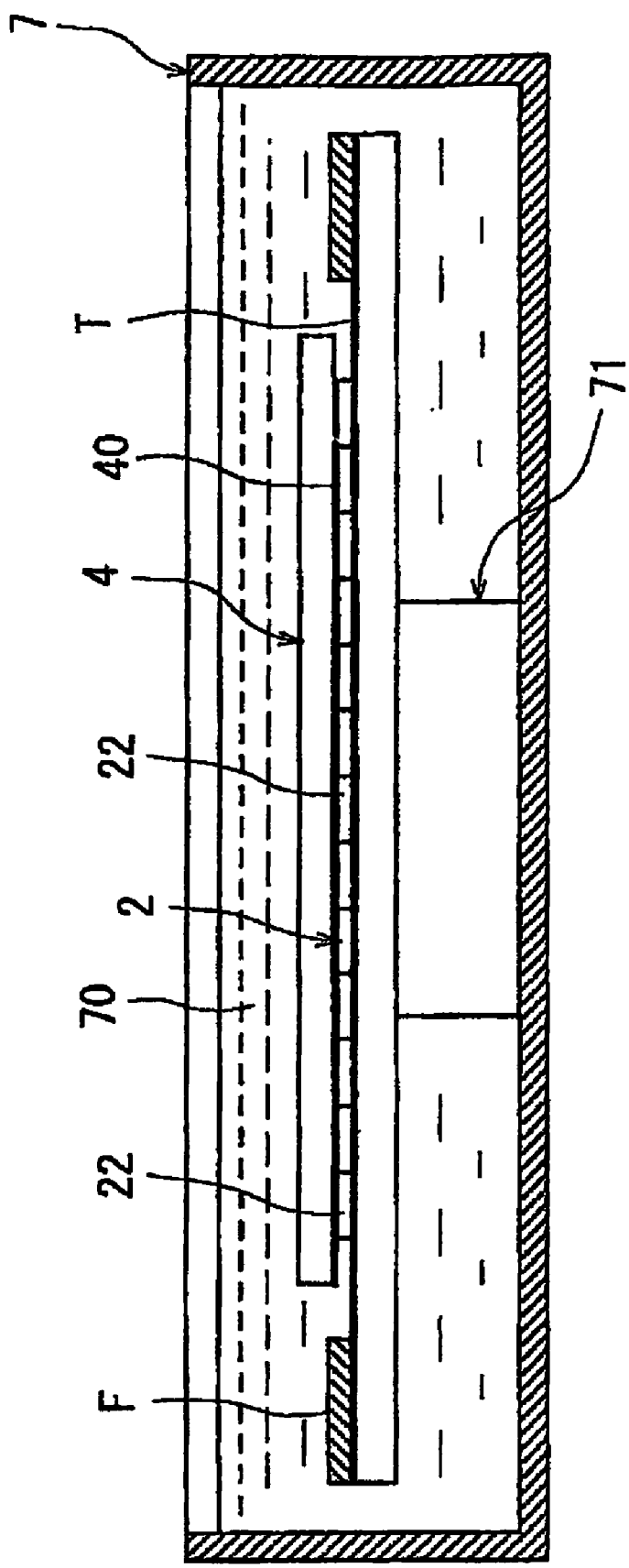
FIG. 10 is a sectional side view for illustrating a holding force decreasing step in the wafer processing method according to the present invention.

After performing the adhesive tape attaching step, a holding force decreasing step is performed in such a manner that the wafer 2 and the rigid plate 4 are immersed in hot water to introduce the hot water to the adhesive resin 40 through the water permeable layers 43 filling the plural grooves 41 formed on the front side 4*a* of the rigid plate 4, so that the adhesive resin 40 attaching the rigid plate 4 and the wafer 2 to each other is swelled by the inclusion of the hot water to thereby decrease the holding force of the adhesive resin 40. More specifically, as shown in FIG. 10, a water tank 7 having a support bed 71 is prepared, and the wafer 2 with the rigid plate 4 supported through the adhesive tape T to the annular frame F is placed on the support bed 71 (the wafer 2 has already been divided into the individual optical devices 22, which are attached to the rigid plate 4). In this condition, hot water 70 having a temperature of 90°, for example, is poured into the water tank 7 to immerse the wafer 2 and the rigid plate 4 in the hot water 70. As a result, the hot water 70 is effectively introduced to the adhesive resin 40 through the water permeable layers 43 (see FIG. 6C) filling the plural grooves 41 formed on the front side 4*a* of the rigid plate 4, so that the adhesive resin 40 is swelled by the inclusion of the hot water 70 to cause a decrease in holding force.

Figure 11:
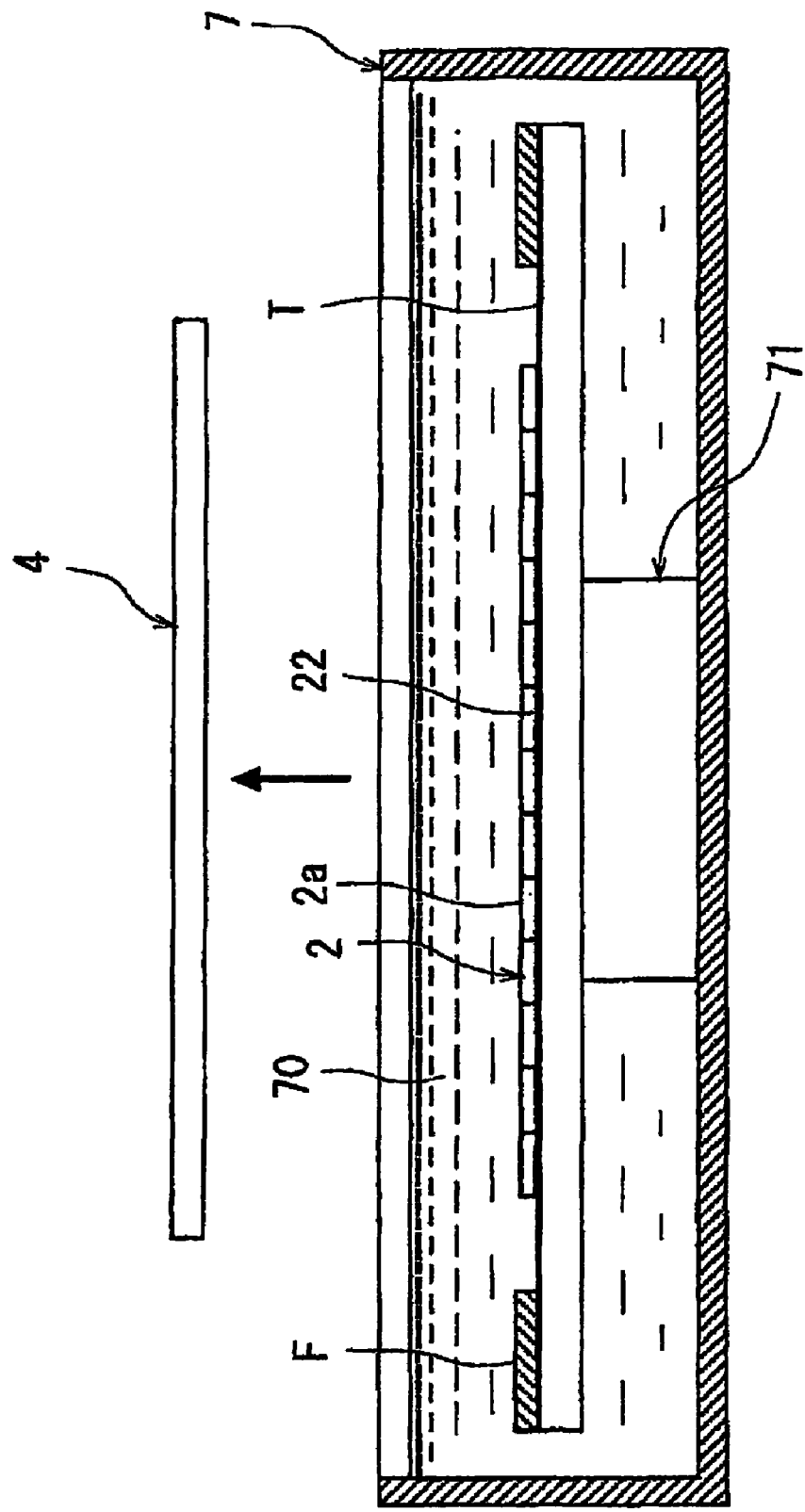
FIG. 11 is a sectional side view for illustrating a rigid plate removing step in the wafer processing method according to the present invention.

After performing the holding force decreasing step to decrease the holding force of the adhesive resin 40 attaching the wafer 2 and the rigid plate 4 to each other, a rigid plate removing step is performed to remove the rigid plate 4 from the front side 2*a* of the wafer 2 as shown in FIG. 11. Thus, the rigid plate removing step is performed after the holding force decreasing step, so that the rigid plate 4 can be easily removed from the front side 2*a* of the wafer 2. When laser processing or cutting is performed to form the division grooves 210 along the streets 21 on the front side 2*a* of the wafer 2 in the division groove forming step mentioned above, debris or chips may adhere to the front side 2*a* of the wafer 2. However, by performing the holding force decreasing step, the adhesive resin 40 is swelled to catch the debris or chips. Accordingly, in removing the rigid plate 4, the debris or chips can be removed together with the rigid plate 4 from the front side 2*a* of the wafer 2.

Figure 12:
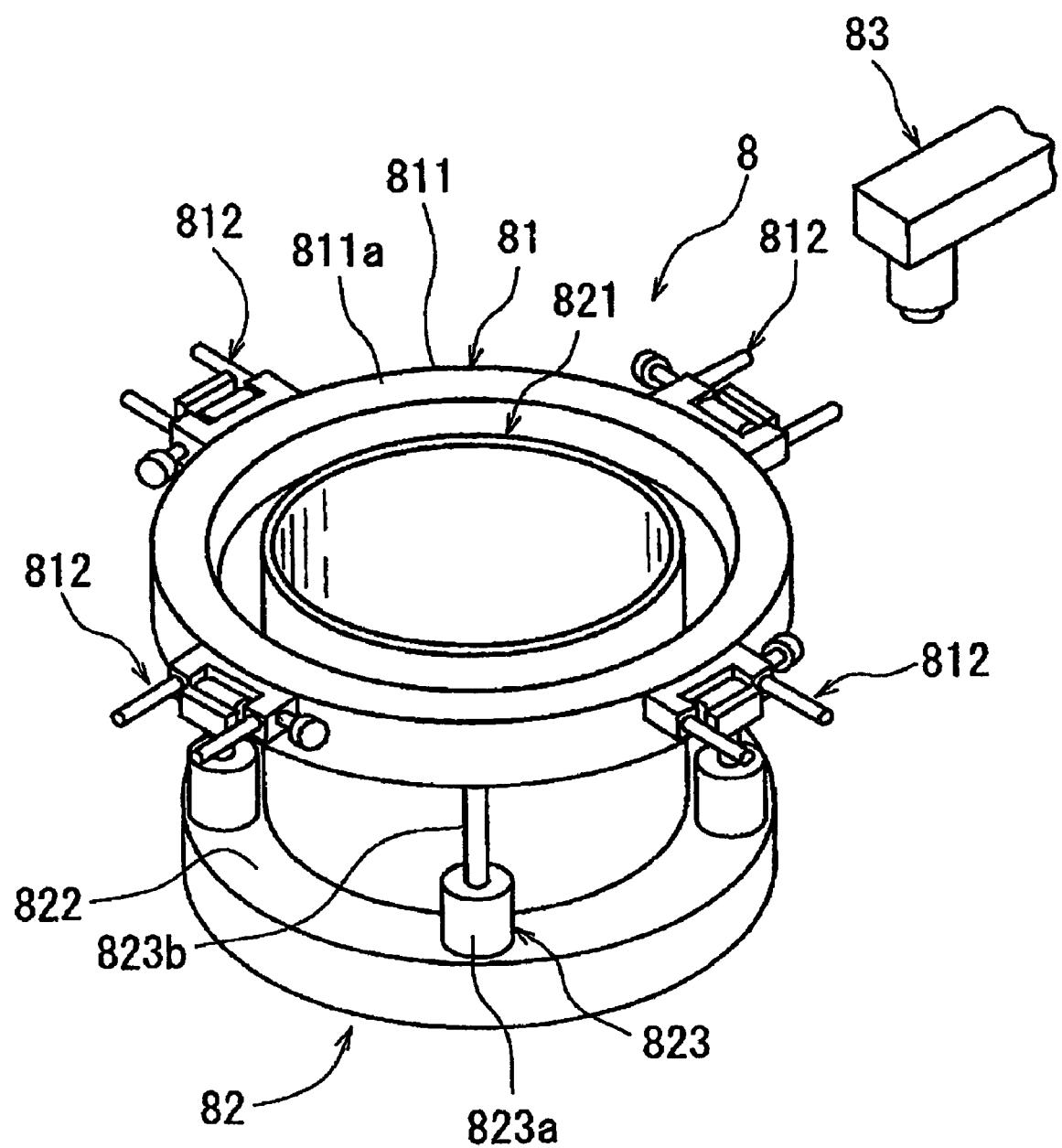
FIG. 12 is a perspective view of a pickup apparatus for performing a pickup step in the wafer processing method according to the present invention.

After performing the rigid plate removing step, a pickup step is performed in such a manner that the individual optical devices 22 divided from each other and attached to the adhesive tape T supported to the annular frame F are picked up from the adhesive tape T. This pickup step is performed by using a pickup apparatus 8 shown in FIG. 12. The pickup apparatus 8 shown in FIG. 12 includes frame holding means 81 for holding the annular frame F, tape expanding means 82 for expanding the adhesive tape T supported to the annular frame F held by the frame holding means 81, and a pickup collet 83. The frame holding means 81 includes an annular frame holding member 811 and a plurality of clamps 812 as fixing means provided on the outer circumference of the frame holding member 811. The upper surface of the frame holding member 811 functions as a mounting surface 811*a* for mounting the annular frame F thereon. The annular frame F mounted on the mounting surface 811*a* is fixed to the frame holding member 811 by the clamps 812. The frame holding means 81 is supported by the tape expanding means 82 so as to be vertically movable.

Figure 13A:
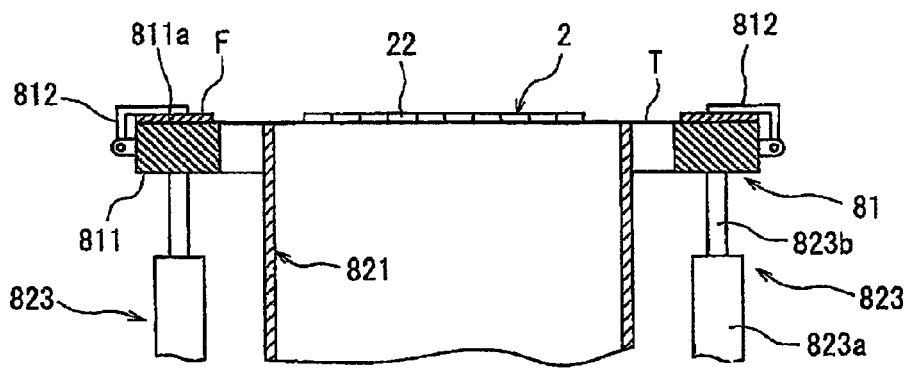
FIGS. 13A to 13C are sectional side views for illustrating the pickup step using the pickup apparatus shown in FIG. 12.
Figure 13B:
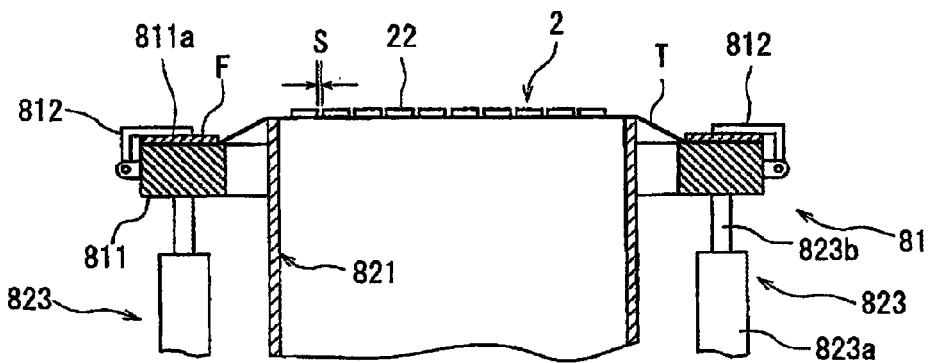

The tape expanding means 82 includes an expanding drum 821 provided inside of the annular frame holding member 811. The expanding drum 821 has an outer diameter smaller than the inner diameter of the annular frame F and an inner diameter larger than the outer diameter of the wafer 2 attached to the adhesive tape T supported to the annular frame F. The expanding drum 821 has a supporting flange 822 at the lower end of the drum 821. The tape expanding means 82 further includes supporting means 823 for vertically movably supporting the annular frame holding member 811. The supporting means 823 is composed of a plurality of air cylinders 823*a* provided on the supporting flange 822. Each air cylinder 823*a* is provided with a piston rod 823*b* connected to the lower surface of the annular frame holding member 811. The supporting means 823 composed of these plural air cylinders 823*a* functions to vertically move the annular frame holding member 811 so as to selectively take a reference position where the mounting surface 811*a* is substantially equal in height to the upper end of the expanding drum 821 as shown in FIG. 13A and an expansion position where the mounting surface 811*a* is lower in height than the upper end of the expanding drum 821 by a predetermined amount as shown in FIG. 13B.

Figure 13C:
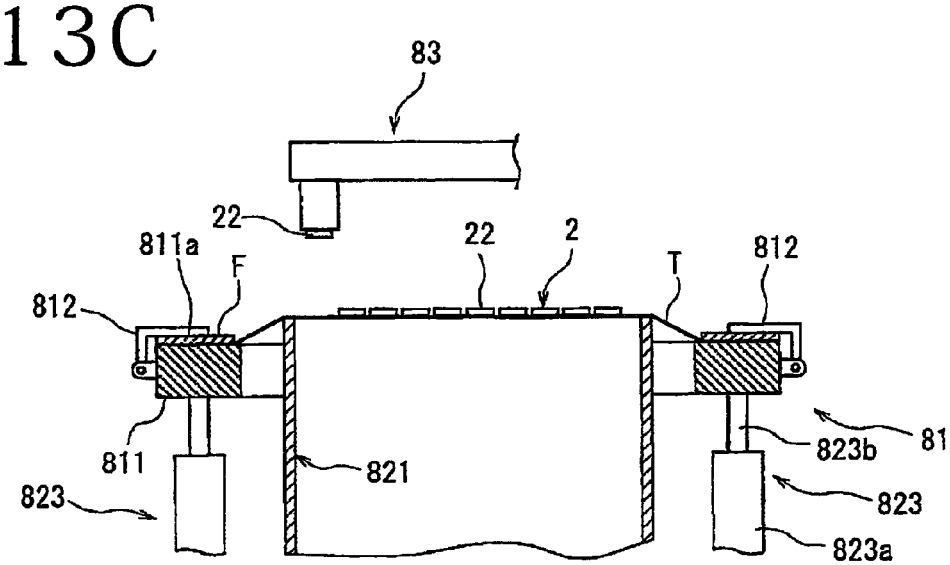

The pickup step using the pickup apparatus 8 will now be described with reference to FIGS. 13A to 13C. As shown in FIG. 13A, the annular frame F supporting the wafer 2 through the adhesive tape T (the wafer 2 being divided into the individual optical devices 22 along the streets 21) is mounted on the mounting surface 811*a* of the frame holding member 811 of the frame holding means 81 and fixed to the frame holding member 811 by the clamps 812 (frame holding step). At this time, the frame holding member 811 is set at the reference position shown in FIG. 13A. Thereafter, the air cylinders 823*a* as the supporting means 823 of the tape expanding means 82 are operated to lower the frame holding member 811 to the expansion position shown in FIG. 13B. Accordingly, the annular frame F fixed to the mounting surface 811*a* of the frame holding member 811 is also lowered, so that the adhesive tape T supported to the annular frame F comes into abutment against the upper end of the expanding drum 821 and is expanded as shown in FIG. 13B (tape expanding step). As a result, the spacing S between any adjacent ones of the individual optical devices 22 attached to the adhesive tape T is increased as shown in FIG. 13B. Thereafter, as shown in FIG. 13C, the pickup collet 83 is operated to hold each optical device 22 under suction and peel off from the adhesive tape T. Each optical device 22 thus picked up by the pickup collet 83 is transported to a tray (not shown) or subjected to a die bonding step. In this pickup step, the spacing S between any adjacent ones of the individual optical devices 22 is increased, so that each optical device 22 can be easily picked up without the contact with its adjacent optical device 22.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer into individual devices along a plurality of crossing streets formed on the front side of said wafer, said individual devices being respectively formed in a plurality of regions partitioned by said streets, said wafer processing method, comprising:

a division groove forming step of forming a division groove having a depth corresponding to the finished thickness of each device on the front side of said wafer along each street;

a rigid plate attaching step of attaching the front side of said wafer having said division grooves to the front side of a rigid plate having a plurality of grooves by using an adhesive resin having the properties of increasing a holding force when cured by the application of ultraviolet radiation and decreasing the holding force when swelled by the inclusion of water after performing said division groove forming step;

a holding force increasing step of applying ultraviolet radiation to said adhesive resin to cure said adhesive resin, thereby increasing the holding force of said adhesive resin after performing said rigid plate attaching step;

a back grinding step of grinding the back side of said wafer to expose said division grooves to the back side of said wafer, thereby dividing said wafer into said individual devices after performing said holding force increasing step;

an adhesive tape attaching step of attaching the back side of said wafer to an adhesive tape after performing said back grinding step;

a holding force decreasing step of immersing said wafer and said rigid plate in hot water to swell said adhesive resin, thereby decreasing the holding force of said adhesive resin after performing said adhesive tape attaching step; and a rigid plate removing step of removing said rigid plate from the front side of said wafer after performing said holding force decreasing step;

said rigid plate attaching step including the steps of filling each groove formed on the front side of said rigid plate with a water permeable layer having good water permeability and next attaching the front side of said wafer through said adhesive resin to the front side of said rigid plate, and said holding force decreasing step including the step of introducing said hot water to said adhesive resin through said water permeable layer filling each groove formed on the front side of said rigid plate.

2. The wafer processing method according to claim 1, wherein each groove formed on the front side of said rigid plate has a width of 0.1 to 0.5 mm and a depth of 0.1 to 0.5 mm, and the spacing of any adjacent ones of said plural grooves formed on the front side of said rigid plate is set to 1 to 2 mm.

3. The wafer processing method according to claim 1, wherein said rigid plate is formed of a material capable of transmitting ultraviolet radiation; and said holding force increasing step includes the step of applying ultraviolet radiation from the back side of said rigid plate through said rigid plate to said adhesive resin.

4. The wafer processing method according to claim 1, wherein said division groove forming step includes the step of applying a laser beam having an absorption wavelength to said wafer from the front side of said wafer along each street, thereby forming said division groove along each street.

5. The wafer processing method according to claim 4, further comprising the step of forming a layer of said adhesive resin on the front side of said wafer before performing said division groove forming step;

said laser beam being applied through said layer of said adhesive resin to the front side of said wafer in said division groove forming step;

said rigid plate attaching step including the step of attaching the front side of said wafer to the front side of said rigid plate through said layer of said adhesive resin formed on the front side of said wafer.

6. The wafer processing method according to claim 1, wherein said adhesive tape attaching step includes the step of attaching the back side of said wafer to the front side of said adhesive tape supported to an annular frame.

* * * * *